United States Patent

[11] 3,579,795

[72] Inventor Per Aron Burman
Temple City, Calif.

[21] Appl. No. 848,545
[22] Filed Aug. 8, 1969
[45] Patented May 25, 1971
[73] Assignee Burroughs Corporation
Detroit, Mich.

[54] COMPONENT REMOVING TOOL
17 Claims, 5 Drawing Figs.

[52] U.S. Cl. .......... 29/252, 29/278
[51] Int. Cl. .......... B23p 19/04
[50] Field of Search .......... 29/203 (H), 206, 252, 270, 275, 278

[56] References Cited

UNITED STATES PATENTS

| | | | |
|---|---|---|---|
| 1,346,022 | 7/1920 | Hassel | 29/278X |
| 3,069,761 | 12/1962 | Sommer | 29/252 |
| 3,117,370 | 1/1964 | Kauppi et al. | 29/206 |
| 3,210,836 | 10/1965 | Johanson et al. | 29/278 |
| 3,443,297 | 5/1969 | Lusby, Jr. | 29/206X |

*Primary Examiner*—Granville Y. Custer, Jr.
*Attorney*—Christie, Parker & Hale

ABSTRACT: A power augmented handtool particularly useful for removing integrated circuit components from a printed circuit board is described. The tool has a body in which a plunger is movable between an extended and a retracted position. A pair of opposed, component gripping, jaws are pivotally connected to the plunger at the nose end of the tool. When the plunger is in the retracted position, the jaws are positively cammed open. While the plunger travels toward the extended position, the jaws are resiliently biased open. When the plunger is in the extended position, the jaws are positively cammed to a closed position to grip a circuit board component. A relatively strong spring biases the plunger toward the retracted position so that when the solder holding a component to a printed circuit board is melted, the jaws draw the component away from the board. The component is released when the jaws are cammed open when the plunger reaches the retracted position. Either compressed air pressure or a mechanical arrangement may be employed for extending the plunger and jaws.

INVENTOR.
PER ARON BURMAN

BY

Christie, Parker & Hale
ATTORNEYS

COMPONENT REMOVING TOOL

BACKGROUND OF THE INVENTION

This invention is in the field of handtools and particularly clamping and pulling tools useful for removing components from printed circuit boards.

A substantial problem is handling printed circuit boards is the removal of components therefrom. If a printed circuit board is damaged or becomes obsolete, it may be desirable to remove components for salvage, or if a component fails or is unsatisfactory, it may be desired to remove an individual component from the board. The problem becomes particularly acute with the advent of multiple lead integrated circuit components which actually include many circuit elements in an individual package, and the individual packages form the components soldered to the printed circuit board.

In one type of integrated circuit component which is widely used, 14 leads, in two parallel rows of seven each, are inserted through holes in a printed circuit board. These 14 leads protrude a short distance through the opposite side of a printed circuit board from the component package and are clinched over at a small angle and then soldered to conductors on the printed circuit board for completing electrical circuits and also to provide mechanical strength. The solder forms the principal mechanical attachment of the component package to the printed circuit board. In other integrated circuit components greater numbers and other arrangements of leads are provided for soldering through printed circuit boards in substantially the same manner. The forementioned integrated circuit component having 14 leads is normally about three-fourths inch long and one-fourth inch wide and, because of the rows of leads arranged along the sides of the component, it can be gripped only at the ends.

In the past the removal of integrated circuit components from printed circuit boards has been very time consuming, and a substantial scrap rate due to damaged components has been encountered. Thus, for example, if a component is gripped with pliers or the like, there is little control over the forces applied and damage to components often results. The only specialty tools available for removing printed circuit components have been difficult to handle and has subjected operators to the possibility of burns when the solder is heated. It is, therefore, desirable to have a safe and reliable hand tool for applying a uniform removing force to integrated circuit components.

BRIEF SUMMARY OF THE INVENTION

In the practice of this invention according to a preferred embodiment, there is provided a tool having a pair of openable and closable opposed jaws movable between an extended and a retracted position. Means are provided for extending the jaws in an open position, and for closing the jaws upon reaching the extended position. Means are also provided for biasing the jaws toward a retracted position to withdraw a circuit component.

In particular, in a preferred embodiment a longitudinally movable plunger is provided in a housing and a pair of opposed jaws are mounted on the plunger adjacent one end of the housing. Means are provided for positively camming the jaws toward a closed position when the plunger is extended and for positively camming the jaws to an open position when the plunger is retracted. Further, means are provided for resiliently biasing the jaws open while the plunger travels between the retracted and extended positions. Means are provided for extending the plunger and for resiliently biasing the plunger toward the retracted position.

DRAWINGS

Objects and many of the attendant advantages of this invention will be appreciated as the same becomes better understood by reference to the following detailed description, when considered in connection with the accompanying drawings wherein.

Throughout the drawings like reference numerals refer to like parts.

DESCRIPTION

Figure 1:
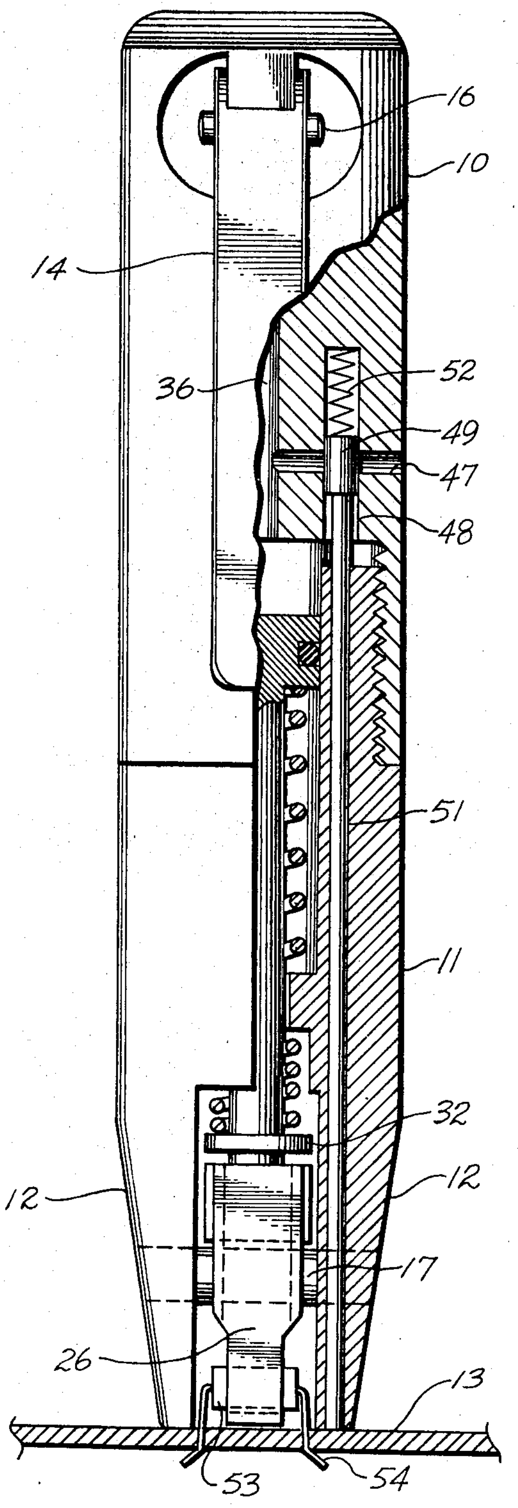
FIG. 1 illustrates in side cutaway a tool constructed according to the principles of this invention.
Figure 2:
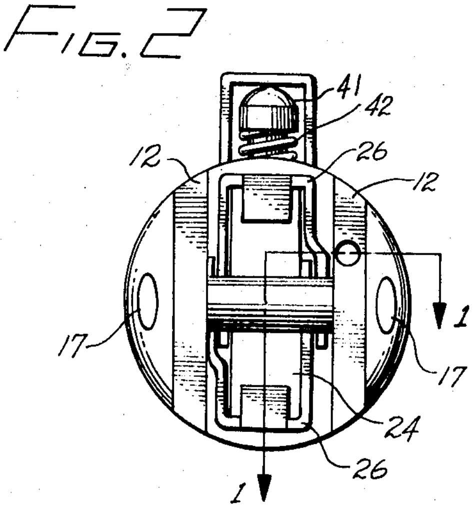
FIG. 2 is an end view of the nose of the tool of FIG. 1.

FIGS. 1 and 2 illustrate in side and end views, respectively, a power augmented handtool constructed according to the principles of this invention. As illustrated in this embodiment, there is provided a tool with a hand grippable body having a substantially cylindrical upper body portion 10 and a lower body piece 11 which includes a pair of parallel depending legs 12 defining a transverse slot in the nose of the tool. The ends of the legs 12 are pressed firmly against a conventional printed circuit board 13 when the tool is operated as described hereinafter in greater detail. At the nose of the tool a transverse cylindrical pin 17 extends across the slot between the legs 12. An operating handle 14 is pivotally mounted on one side of the upper body piece 10 by a pin 16 so that a squeezing action by the operator on the handle moves the handle towards the body of the tool.

Figure 3:
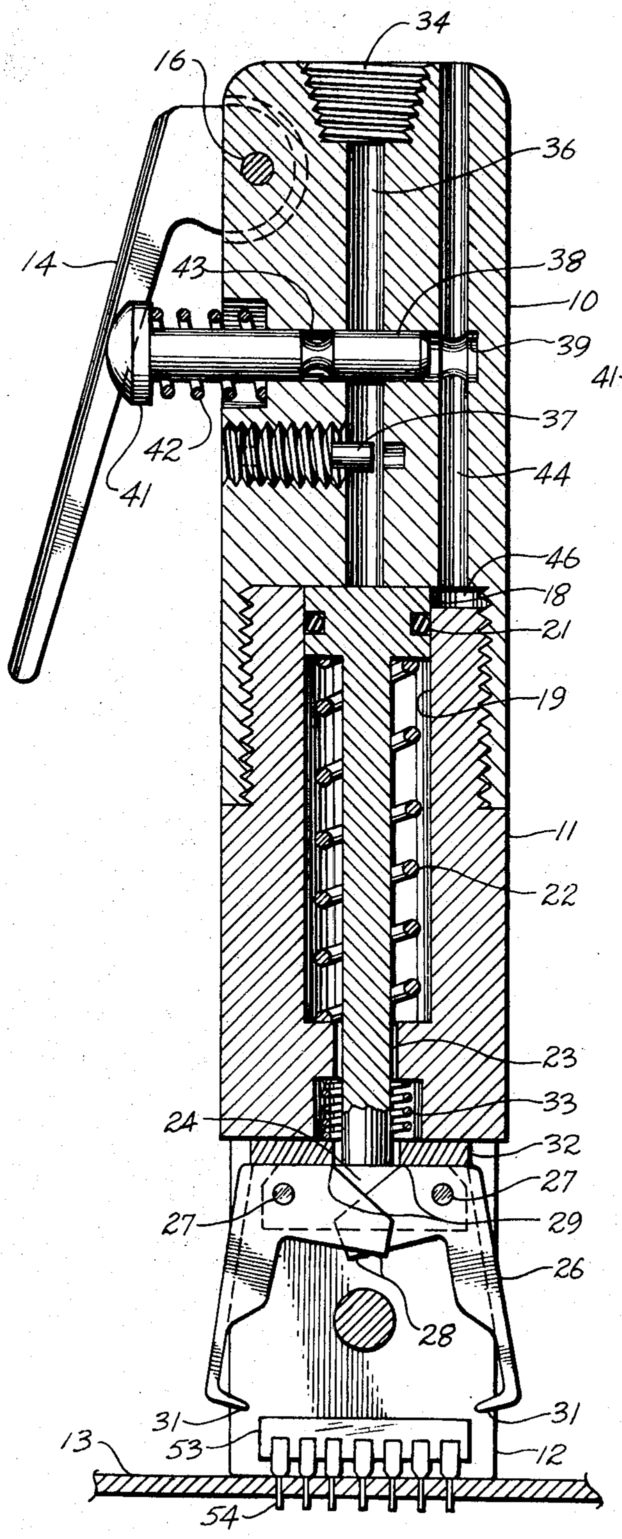
FIG. 3 is a longitudinal cross section of the tool of FIG. 1 with the internal operating mechanism in a retracted position.
Figure 4:
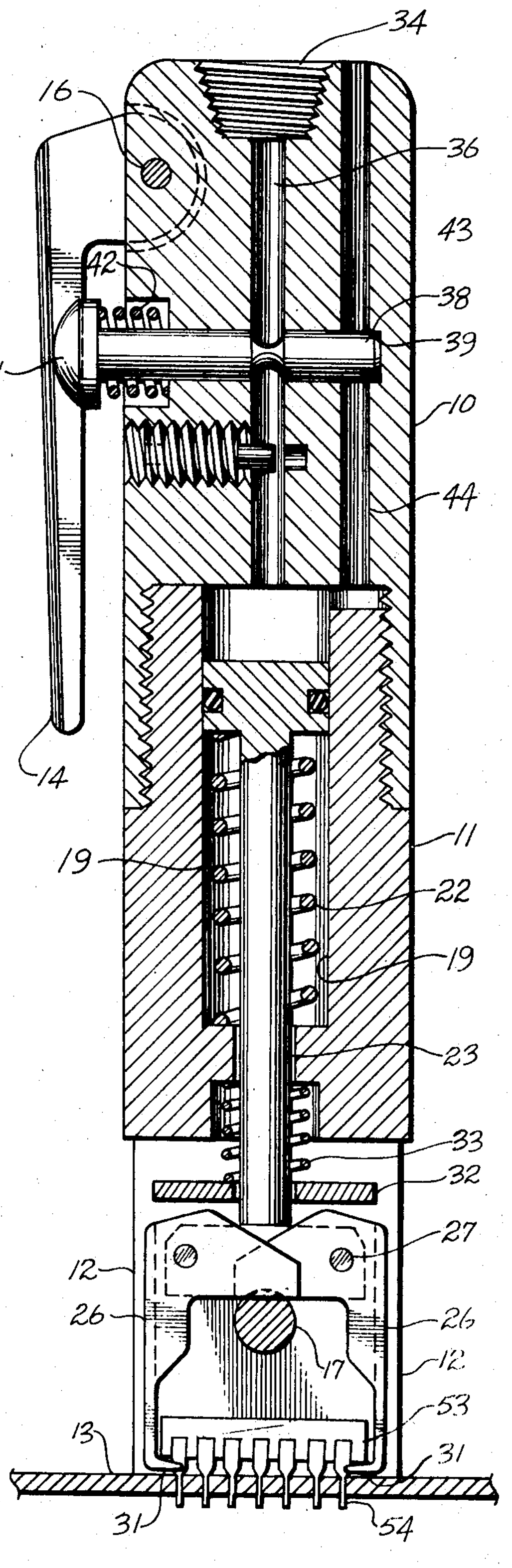
FIG. 4 is a cross section similar to FIG. 3 with the internal operating mechanism in a retracted position.

Referring now to the longitudinal cross sections of FIGS. 3 and 4, a piston 18 is mounted in a cylindrical bore 19 in the body piece 11 and is sealed thereto by an O-ring 21. A relatively strong spring 22 biases the piston 18 toward the upper end of the cylinder or bore 19. A shaft 23 extends from the piston 18 and out of the forward end of the cylindrical bore 19. A yoke 24 extending transversely of the tool is connected rigidly to the end of the shaft 23 so as to be positioned in the slot between the legs 12. A pair of opposed jaws 26 are each pivotally mounted on the yoke 24 by a pin 27.

Each of the jaws 26 is bent from sheet metal to have a substantially U-shaped cross section at the upper end with the legs of the U mounted on the opposite ends of one of the pins 27 to straddle the yoke 24. A camming surface 28 is provided on each of the legs of the U-shaped jaws for engagement with the transverse pin 17 for camming the jaws toward a closed position with the jaws closer together as described hereinafter in greater detail. Likewise, on each of the legs of the U-shaped jaws there is a camming ear 29 for camming the jaws toward an open position with the ends of the jaws further apart. Each of the jaws 26 also has a work engaging tab 31 at the tip arranged so that the tabs on the two jaws are in opposition to each other.

Another way of viewing the jaws is to consider that each of the jaws has a substantially L-shape with the work engaging tab 31 being on the end of the upright leg of the L (i.e., an inverted L in FIGS. 3 & 4) and extending in the same direction as the foot of the L. Each jaw is mounted on a pin 27 at the intersection of the leg and the foot so that the feet of the two L-shaped jaws overlap. A camming surface 28 on the top of the foot of the L serves to cam the jaws apart and a camming ear 29 on the bottom of the foot of the L serves to cam the jaws together.

A rectangular washer 32 is positioned between the camming ears 29 on the jaws and the portion of the lower housing 11 between the legs 12. A light spring 33 biases the washer 32 toward the camming ears 29.

In the upper body portion 10 a threaded opening 34 is provided at the top for connection to a compressed air line or the like (not shown). An axial inlet passage 36 leads from the tapped air inlet 34 to the upper face of the piston 18 in the lower body piece. An adjustable metering pin or needle 37 extends across the passage 36 for controlling the volume of air passing through the tool. A control plunger 38 is mounted in a transverse bore 39 in the upper body piece 10 and includes a head 41 bearing against the inside of the movable handle 14. A spring 42 biases the plunger 38 toward a position out of the housing against the handle. A peripheral groove or necked down portion 43 is provided around the plunger 38 so that when the groove 43 is aligned with the passage 36 (see FIG. 4) air may pass therethrough for operating the handtool as hereinafter described in greater detail. The airflow passage through the tool also includes a longitudinally extending passage 44 through the upper body portion 10 for exhausting air and an open portion 46 at the upper end of the lower body portion adjacent the face of the piston 18 for allowing air to flow from the space above the piston to the exhaust passage 44.

Referring again to the cutaway portion of FIG. 1, a transverse passage 47 in the upper body piece 10 leads from the axial inlet passage 36 to the exterior of the tool housing. A blind longitudinal bore 48 intersects the transverse passage 47, and a cylindrical plug 49 is mounted for sliding motion in the longitudinal bore 48. An elongated shaft 51 is connected to the plug 49 and passes through the lower housing portion 11 so as to normally extend a short distance beyond the end of one of the depending legs 12. A spring 52 in the blind bore 48 urges the plug 49 and the shaft 51 downwardly so that the plug is normally clear of the transverse passage 47 so that air can freely pass from the axial passage 36 to the exterior of the tool. When the tool is pressed against a printed circuit board 13 and the shaft 51 is pressed into the housing thereby compressing the spring 52 and placing the plug 49 across the transverse 47 to block air blow.

As mentioned hereinabove the hand tool is particularly useful in the removal of integrated circuit components from a printed circuit board. Thus, there is illustrated a typical integrated circuit component package 53 mount on the printed circuit board 13. A plurality of electrical leads 54 extend from each side of the integrated circuit package 53 and thence downwardly through holes in the printed circuit board. These leads are clinched mutually outwardly at about 45° as can bee seen in FIG. 1 and soldered on the lower or reverse side of the printed circuit board. The main body of the integrated circuit package 53 is conventionally spaced a short distance above the printed circuit board which permits the tabs 31 on the jaws of the tool to pass between the board and the integrated circuit package at the ends where there are no leads.

The operation of the tool can be seen with particular reference to FIGS. 3 and 4. When it is desired to remove an integrated circuit component package 53 from a printed circuit board 13, the tool is placed against the board so that the legs 12 straddle and are parallel to the sides of the component to be removed. At the time that the tool is placed over the component, the jaws 26 are in the retracted and open position as illustrated in FIG. 3. This is the case since the spring 22 forces the piston 18 and shaft 23 away from the nose of the tool. This brings the jaws 26 up so that the camming ears 29 are in engagement with the washer 32 which bears against the lower body piece 11. The force of the washer against the camming ears inboard of the pins 27 pivots the L-shaped jaws outwardly to the position illustrated.

When the tool is properly positioned over the component, the operator squeezes the handle 14 toward the body of the tool thereby moving the plunger 38 so that the groove 43 therein is aligned with the longitudinal air inlet passage 36. This permits compressed air to flow from the top of the tool through the inlet passage and act on the face of the piston 18. At the same time that the groove 43 opens the passage 36 so that air can enter the tool, the end of the plunger 38 crosses and thereby closes the longitudinal exhaust passage 44 and prevents air from leaving the tool.

Air pressure on the face of the piston 18 causes it, the shaft 23, and the yoke 24 to travel forwardly toward the nose of the tool. As this assembly moves forwardly, the light spring 33 causes the washer 32 to follow the yoke and jaws, thereby maintaining light pressure on the camming ears 29 to maintain the jaws in an open position.

The piston 18 reaches the end of its stroke when the yoke 24 engages the transverse pin 17 between the legs 12. The pin 17 also engages the camming surfaces 28 on the jaws thereby pivoting the jaws about the pins 27 so that the tabs 31 on the ends of the jaws are swung inwardly to pass between the integrated circuit component package and the printed circuit board 13. The spring 33 urging the washer 32 toward the jaws has a sufficiently short length that little if any pressure is applied to the washer and hence to the camming ears 29 as the opposite camming surfaces 28 engage the pin 17.

When the tabs 31 are in engagement with the lower surface of the integrated circuit package 53, the operator releases the handle 14 so that the plunger 38 again closes the axial inlet passage 36 cutting off the air supply and at the same time longitudinal the longitudinal exhaust passage 44 which is in communication with the open portion adjacent the face of the piston 18. This permits the small volume of air above the piston to be relieved to atmospheric pressure and the spring 22 then exerts a substantial upward force on the jaws, tending to lift the integrated circuit package away from the printed circuit board.

Once the tool is so engaged with the integrated circuit package urging the package away from the board, heat is applied to the leads 54 in order to melt the solder securing the package to the printed circuit board. When the solder is molten, the force of the spring 22 lifts the integrated circuit package from the board, thereby straightening the clinched leads as they are drawn through the holes in the board.

The strength of the spring 22 is selected so as to be slightly stronger than needed to straighten clinched pins on the component when not soldered. Thus, for example, in one embodiment components having 14 leads were mounted on a printed circuit board and the leads extending through the board were clinched at 45° but not soldered. These test components were removed by pulling away from the board and a spring 22 was employed in the tool to exert a force slightly stronger than the maximum force required to lift any of the test components. This assures that a uniform, adequate but not excessive force is exerted to remove the component. The force exerted is thereby removed from the discretion of the operator and scrap rate is greatly reduced. By keeping the force of the spring only slightly greater than needed, it is assured that the solder on all 14 pins is melted before the component is lifted. If only one pin out of the 14 remains soldered the component is not lifted and damage to pins is avoided.

As the integrated circuit package is freed from the board, the jaws, and hence the piston 18, are free to move away from the board under the urging of the spring 22. When the piston approaches its uppermost position, the camming ears 29 on the jaws reengage the washer 32 thereby camming the jaws into an open position again, which releases the integrated circuit component package and readies the tool for another cycle of operation.

Reliability of operation of the tool is assured by maintaining the spacing between the legs 12 only slightly larger than the outermost extent of the leads 54 beside the component package so that the tool is necessarily aligned with the package before it is operated. A moderate tolerance in positioning the tool relative to the length of the component is present since the force on the first jaw to engage the component can shift the tool slightly. It is also assured that the legs 12 on the tool are tightly engaged with the printed circuit board before the jaws are actuated by providing the shaft 51 which operates the plug 49 which closes the transverse bleed bore 47 in communication with the air inlet passage 36. If the handle 14 is inadvertently depressed prior to engaging the nose of the tool with the printed circuit board, which depresses the shaft 51 and closes the transverse passage 47, the air let into the tool is bled out through the transverse passage thereby preventing actuation of the piston 18 and jaws.

With such a tool, it is found that an operator can quickly place the tool in proper position over a component to be removed without danger or inconvenience. Depression of the operating handle reliably engages the jaws with the component and release of air pressure causes a substantial lifting force on the component but not sufficient to damage either the component or the printed circuit board. As soon as the solder on the component leads has been melted, the tool lights the component from the board substantially straightening the pins and immediately releases the component so that the tool is ready for another cycle of operation.

Figure 5:
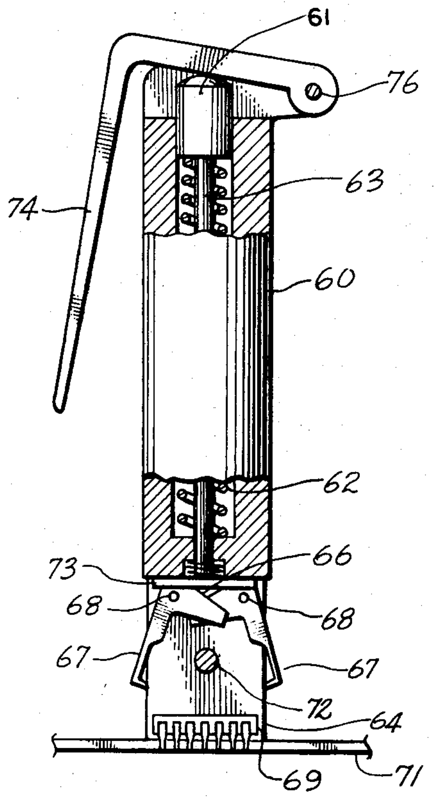
FIG. 5 illustrates another embodiment of component removing tool constructed according to the principles of this invention.

If it is not desired to employ pneumatic drive for a component removing tool, an entirely mechanical handtool can be employed. Thus, as illustrated in FIG. 5, there is provided an entirely hand operated removal tool. As illustrated in this embodiment, there is provided a housing 60 in which a plunger 61 is free to move longitudinally and is urged away from the nose of the tool by a compression spring 62. A shaft 63 on the plunger extends through a lower portion of the housing 60 so as to terminate in a transverse slot between a pair of depending legs 64. A yoke 66 on the end of the shaft 63 supports a pair of jaws 67 by way of a pair of pins 68. The two jaws 67 are preferably made in substantially the same geometry as the jaws 26 in the preferred embodiment hereinabove described and illustrated. Such a mounting and shape of the jaws enables them to open and close and engage and disengage a circuit component 69 on a printed circuit board 71 substantially as hereinabove described and illustrated. A transverse pin 72 between the legs 64 and spring-loaded washer 73 further effect proper operation of the jaws.

In order to depress the plunger 61 and thereby operate the jaws 67, and L-shaped handle 74 is pivotally mounted on the housing 60 by a pin 76. Thus, when an operator squeezes the handle 74 toward the housing 60, it pivots about the pin 76 thereby depressing the plunger 61 to cause the tool to operate substantially as hereinabove described. By providing a relatively long arm on the L-shaped handle an appreciable leverage is gained so that substantial operator fatigue is avoided. It is found that if a very large number of circuit components need be removed, however, that operation of the strictly mechanical tool is fatiguing and it is preferred to employ the pneumatic tool of the above preferred embodiment.

It will be apparent that many other modifications and variations can be made in apparatus constructed according to the principles of this invention. Thus, for example, other mechanical arrangements or electrically operated devices may be employed for actuating the plunger to open the jaws to engage the components. Similarly, although the tool has been described and illustrated for engagement with a particular component, other sizes and variations in geometry required to accommodate another component can be provided. Many other modifications and variations of the present invention will be apparent to one skilled in the art.

I claim:

1. An electronic component removal tool comprising:
means for positively gripping a component detachably connected to a circuit element;
means for resiliently urging the gripped component away from the circuit element; and
means for positively releasing the means for gripping when the gripped component is detached from the circuit element.

2. A tool comprising:
a tool body;
a pair of opposed jaws;
means for pivotally mounting both jaws for motion between open and closed positions;
means for moving both jaws toward an extended position relative to the body;
means for positively moving the jaws toward the closed position as the jaws approach the extended position; and
means for resiliently biasing both jaws toward a retracted position relative to the body.

3. A tool as defined in claim 2 further comprising means for positively moving the jaws toward the open position as the jaws approach the retracted position.

4. A tool as defined in claim 3 further comprising means for resiliently biasing the jaws toward the open position during travel thereof between the retracted position and the extended position.

5. A tool as defined in claim 3 wherein the means for moving the jaws toward the extended position comprises a pneumatically actuated plunger.

6. A tool comprising:
a tool body;
a plunger mounted for longitudinal motion in the body between an extended position and a retracted position;
means for applying pressure to the plunger for moving the plunger toward the extended position;
a pair of opposed work engaging jaws;
means for pivotally mounting each of the jaws on the plunger for motion between a mutually open position and a mutually closed position;
means on the tool body for positively moving the jaws toward the open position when the plunger is in the retracted position;
means on the tool body for positively moving the jaws toward the closed position when the plunger is in the extended position; and
means for resiliently biasing the plunger toward the retracted position.

7. A tool as defined in claim 6 wherein the means for applying pressure comprises:
means for applying fluid pressure to an end of the plunger; and
valve means for controllably applying and releasing the means for applying.

8. A tool as defined in claim 6 wherein:
each of the jaws has a substantially L-shape, the work engaging portion of each jaw being at the end of the upright leg of the L;
the means for pivotally mounting each jaw comprises a pair of spaced apart pins each pivotally supporting a jaw substantially at the intersection of the leg and foot of the L;
the means for moving the jaws toward an open position comprises a camming surface on the bottom of the foot of the L; and
the means for moving the jaws toward a closed position comprises a camming surface on the upper portion on the foot of the L.

9. A tool as defined in claim 6 further comprising means for resiliently urging the jaws toward the open position during motion of the plunger between the retracted and extended positions.

10. A tool as defined in claim 6 further comprising a pair of depending legs straddling the jaws and terminating in approximately the same plane as the ends of the jaws in the extended position.

11. A component removing tool comprising:
a tool body;
a plunger mounted for motion in the body between a retracted position and an extended position;
means for selectively applying a force to the plunger for moving the plunger toward the extended position;
spring means for resiliently urging the plunger toward the retracted position upon release of the force;
a transverse yoke mounted on the plunger at the forward end of the tool;
a pair of pivots, one at each end of the yoke;
a pair of L-shaped jaws, one mounted on each of the pivots, each of the jaws having a work engaging portion on the upper end of the upstanding leg of the L;
a pair of legs extending from the body and straddling the jaws; and
a transverse member between the legs for engaging the upper portion of the foot of each of the L-shaped jaws for moving the jaws toward the closed position in the extended position.

12. A tool as defined in claim 11 further comprising:

a washer between the yoke and the body;

spring means for urging the washer toward the yoke; and a camming surface on each of said jaws for engaging the washer for urging the jaws toward the open position at the retracted position.

13. A tool as defined in claim 12 further comprising:

a sensing member extendable from one of the depending legs for contact with a workpiece; and valve means connected to the sensing member for selectively (a) permitting fluid pressure action on the plunger when the sensing member engages a workpiece and (b) preventing fluid pressure action on the plunger when the sensing member is out of engagement with a workpiece.

14. A component removing tool as defined in claim 12 wherein the means for applying a force comprises:

a valve in the tool body;

means for applying fluid pressure to the valve;

a passage from the valve to a portion of the plunger for applying fluid pressure thereto; and hand movable means on the valve body for actuating the valve.

15. A component removing tool as defined in claim 12 wherein the means for applying force comprises:

a first fluid passage interconnecting the exterior of the tool body and the end of the plunger;

a second fluid passage interconnecting the exterior of the tool body and the end of the plunger;

a valve member movable between a first position closing the first passage and opening the second passage, and a second position opening the first passage and closing the second passage;

a spring for biasing the valve member toward the first position;

a lever for moving the valve member toward the second position; and pivot means for mounting the lever on the tool body.

16. A component removing tool as defined in claim 15 further comprising:

a fluid bleed passage interconnecting the exterior of the tool and the first passage between the valve member and the plunger;

a rod mounted in the tool body for longitudinal motion between an extended position and a retracted position, a first end of the rod extending beyond one of the legs in the extended position, and being substantially flush with the end of the leg in the retracted position, the other end of the rod being clear of the fluid bleed passage in the extended position and blocking the fluid bleed passage in the retracted position; and a spring for biasing the rod toward the extended position.

17. A component removing tool as defined in claim 12 wherein the hand actuated means for applying a force comprises:

a lever in engagement with an end of the plunger; and pivot means for mounting the lever on the tool body.